United States Patent
Chung et al.

(10) Patent No.: US 7,035,162 B2
(45) Date of Patent: Apr. 25, 2006

(54) MEMORY DEVICES INCLUDING GLOBAL ROW DECODERS AND OPERATING METHODS THEREOF

(75) Inventors: Hwi-taek Chung, Gyeonggi-do (KR); Byeong-hoon Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/873,104

(22) Filed: Jun. 21, 2004

(65) Prior Publication Data
US 2005/0007859 A1    Jan. 13, 2005

(30) Foreign Application Priority Data
Jul. 12, 2003    (KR)    ............... 10-2003-0047541

(51) Int. Cl.
*G11C 8/00*    (2006.01)
(52) U.S. Cl. .................. 365/230.03; 365/230.06; 365/185.11; 365/185.13
(58) Field of Classification Search ............ 365/230.03, 365/230.06, 185.11, 185.13, 185.33
See application file for complete search history.

(56) References Cited

U.S. PATENT DOCUMENTS

| | | | |
|---|---|---|---|
| 5,506,816 A | | 4/1996 | Hirose et al. |
| 5,568,419 A | * | 10/1996 | Atsumi et al. ............ 365/185.3 |
| 5,621,690 A | | 4/1997 | Jungroth et al. |
| 5,956,268 A | * | 9/1999 | Lee ........................ 365/185.03 |
| 6,072,735 A | * | 6/2000 | Komoriya et al. .......... 365/200 |
| 6,400,637 B1 | * | 6/2002 | Akamatsu et al. ..... 365/230.06 |

FOREIGN PATENT DOCUMENTS
KR    1020020089588 A    11/2002

OTHER PUBLICATIONS

French Search Report for French patent Appl. No. 04 7707 mailed on Oct. 12, 2005.
Notice to Submit Reponse, Korean Appl. No. 10-2003-0047541, dated Jul. 28, 2005.

* cited by examiner

*Primary Examiner*—Connie C. Yoha
(74) *Attorney, Agent, or Firm*—Myers Bigel Sibley & Sajovec PA (57) ABSTRACT

A memory device includes a predecoder that receives a row address and responsively generates a plurality of memory block selection signals, a plurality of word line selection signals, a plurality of source line selection signals, and a plurality of sub-block selection signals including respective groups of signals that correspond to respective levels of a hierarchy of sub-blocks in a plurality of memory blocks. The device further includes a global decoder that receives the sub-block selection signals and responsively generates segment activation signals for respective segments of memory blocks that correspond to respective sub-blocks at a lowest level of the hierarchy of sub-blocks. A plurality of word line decoders are coupled to word lines of respective ones of plurality of the memory blocks, with each word line decoder configured to receive the segment activation signals, a memory block selection signal and the word line selection signals and to responsively generate word line signals on the word lines coupled thereto. A plurality of source line decoders are coupled to source lines of respective ones of the plurality of memory blocks, each source line decoder configured to receive the segment activation signals, with a memory block selection signal, and the source line selection signals and to responsively generate source line signals one the source lines coupled thereto.

23 Claims, 5 Drawing Sheets

MEMORY DEVICES INCLUDING GLOBAL ROW DECODERS AND OPERATING METHODS THEREOF

RELATED APPLICATION

This application claims priority from Korean Patent Application No. 2003-47541, filed on Jul. 12, 2003, in the Korean Intellectual Property Office, the disclosure of which is incorporated herein in its entirety by reference.

BACKGROUND OF THE INVENTION

The present invention relates to integrated circuit memory devices, and more particularly, to multi-block memory devices.

Figure 1:
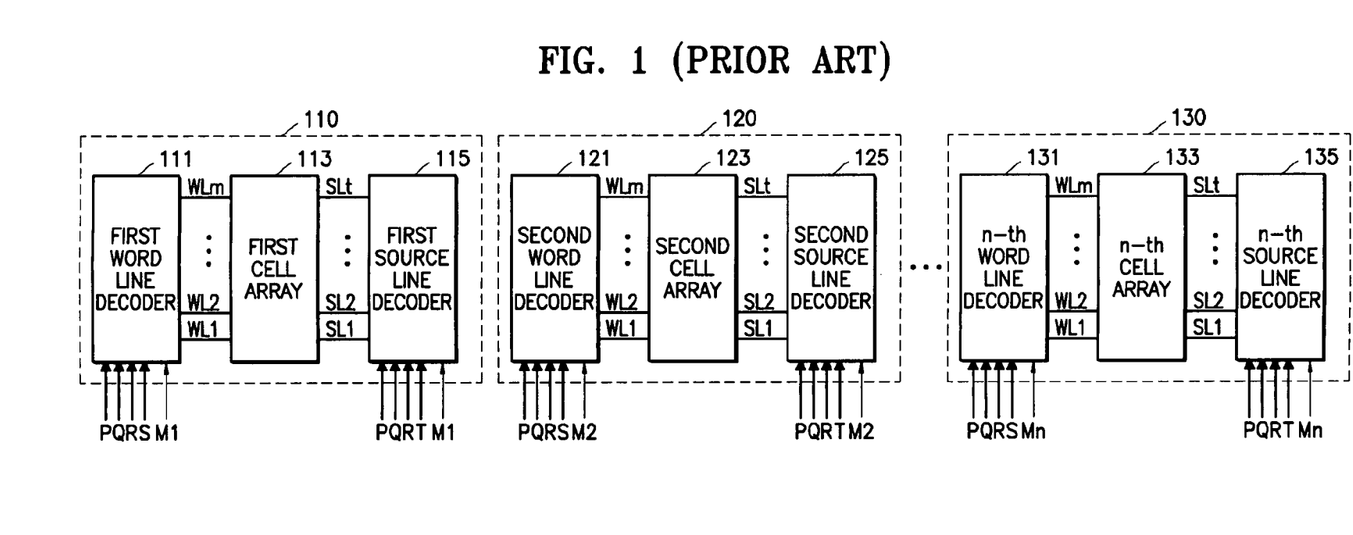
FIG. 1 shows a structure of a conventional memory device.

FIG. 1 shows a semiconductor memory device having conventional row decoders. With reference to FIG. 1, conventional row decoders used in devices, such as flash memory devices may include word line decoders (for example, 111) and source line decoders (for example, 115), employed in each of a plurality of memory blocks 110, 120, ..., 130. Memory blocks 110, 120, ..., 130 each have cell arrays (for example, 113) in addition to the decoders. Cell arrays 113, 123, ..., 133 include cell transistors that store cell data, as shown, for example, in FIG. 5.

Figure 2:
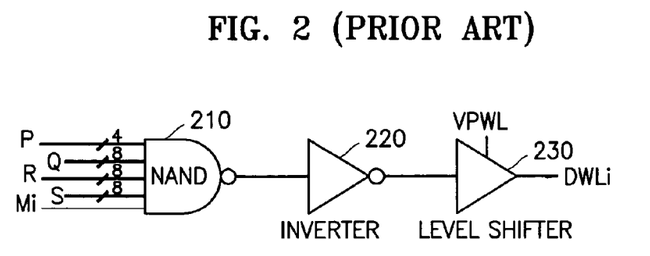
FIG. 2 is a simplified circuit diagram of a word line decoder shown in FIG. 1.

FIG. 2 is a simplified circuit diagram of one of word line decoders 111, 121, ..., 131 shown in FIG. 1. Logic gates 210-230 decode sub-block selection signals P, Q, R, S, Mi and output a word line signal DWLi on a word line in a cell array 113, 123, ..., 133. If the cell arrays 113, 123, ..., 133 each include 2048 (2k) word lines, according to the above, P includes 4 signals to select one of 4 highest-order sub-blocks in the memory blocks 110, 120, ..., 130 corresponding to Mi, Q includes 8 signals to select one of 8 sub-blocks in the sub-blocks selected by P, R includes 8 signals to select one of 8 sub-blocks in the sub-blocks selected by Q, and S includes 8 signals to select one of 8 sub-blocks in the sub-blocks selected by R.

Figure 3:
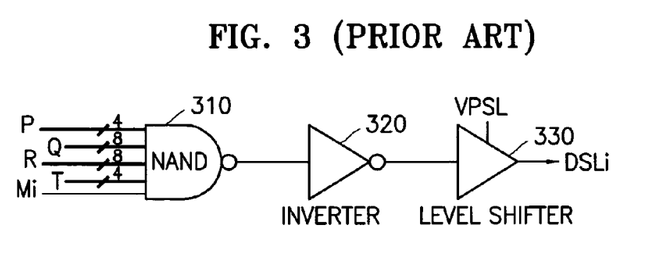
FIG. 3 is a simplified circuit diagram of a source line decoder shown in FIG. 1.
Figure 5:
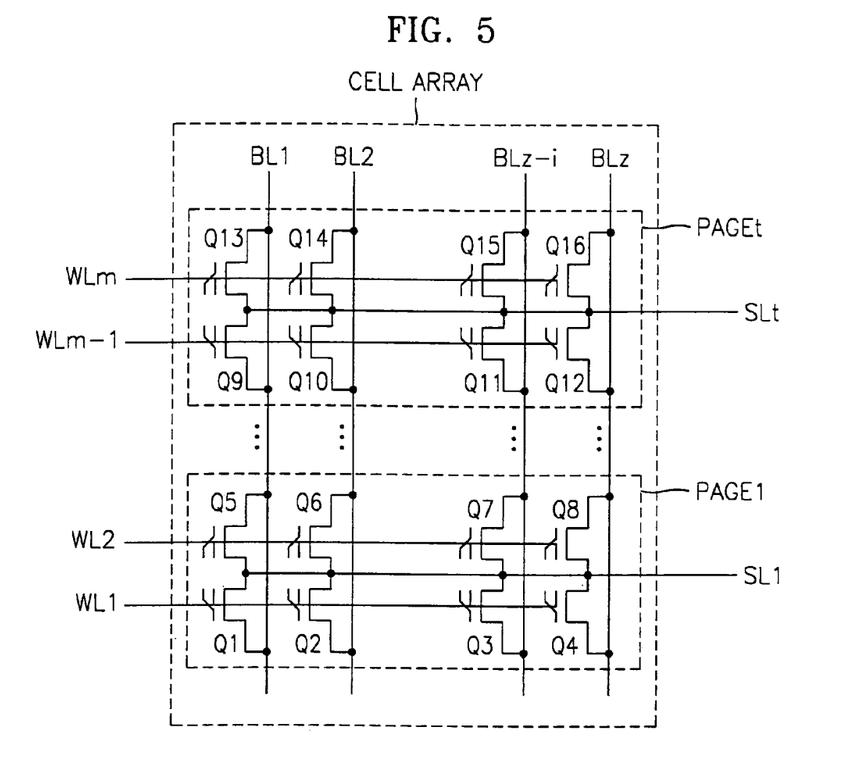
FIG. 5 is a detailed drawing of a cell array of the memory device of FIG. 4.

FIG. 3 is a simplified circuit diagram of one of source line decoders 115, 125, ..., 135 shown in FIG. 1. Logic gates 310–330 decode the sub-block selection signals P, Q, R, S, Mi, and output a source line signal DSLi on a source line in a respective cell array 113, 123, ..., 133. Also, as shown in FIG. 2, if cell arrays 113, 123, ..., 133 are each composed of 2048 (2k) word lines, T includes 4 signals to select a source line corresponding to predetermined segments selected by S. The number of T signals is half of the number of S signals, as each T signal controls two cell transistors connected to two respective word lines as shown in FIG. 5.

The sub-block selection signals P, Q, R, S, T, Mi are produced by a decoder that decodes an externally supplied address signal. In a conventional row decoder of a flash memory device, in order to operate many memory blocks 110, 120, ..., 130 composed of 2048 (2k) word lines as shown in FIG. 1, 54 signal lines are used to transmit the sub-block selection signals P, Q, R, S, T and Mi for each of the memory blocks 110, 120, ..., 130.

In a conventional device as described above, the larger the memory, the greater the number of memory blocks 110, 120, ..., 130, and accordingly, the greater the number of word line decoders 111, 121, ..., 131 and source line decoders 115, 125, ..., 135. If there are a large number word line decoders 111, 121, ..., 131 and source line decoders 115, 125, ..., 135, an even larger number of signal lines may be used to transmit the sub-block selection signals P, Q, R, S, T, Mi, which can consume a significant amount of chip real estate.

SUMMARY OF THE INVENTION

In some embodiments of the invention, a memory device includes a plurality of memory blocks, each block including a plurality of memory cells. The device also includes a predecoder that receives a row address and responsively generates a plurality of memory block selection signals, a plurality of word line selection signals, a plurality of source line selection signals, and a plurality of sub-block selection signals including respective groups of signals that correspond to respective levels of a hierarchy of sub-blocks in the memory blocks. The device further includes a global decoder that receives the sub-block selection signals and responsively generates segment activation signals for respective segments of memory blocks that correspond to respective sub-blocks at a lowest level of the hierarchy of sub-blocks. A plurality of word line decoders are coupled to word lines of respective ones of plurality of the memory blocks, with each word line decoder being configured to receive the segment activation signals, a memory block selection signal and the word line selection signals and to responsively generate word line signals on the word lines coupled thereto. A plurality of source line decoders are coupled to source lines of respective ones of the plurality of memory blocks, each source line decoder being configured to receive the segment activation signals, a memory block selection signal, and the source line selection signals and to responsively generate source line signals one the source lines coupled thereto. The sub-block selection signals may define a number of sub-blocks at the lowest level of the hierarchy of sub-blocks, and the number of segment activation signals may equal the number of sub-blocks at the lowest level of the hierarchy of sub-blocks. The number of sub-block selection signals may be less than the number of segment activation signals.

In further embodiments of the present invention, a flash memory device includes a plurality of memory blocks, each block including a plurality of flash memory cells, each including a source terminal, a drain terminal, and a gate terminal, a plurality of word lines, respective ones of which are coupled to gate terminals of memory cells in respective rows, and a plurality of source lines, respective ones of which are coupled to source terminals of memory cells in respective pairs of adjacent rows. The device further includes a predecoder that receives a row address and responsively generates a plurality of memory block selection signals, a plurality of word line selection signals, a plurality of source line selection signals, and a plurality of sub-block selection signals including respective groups of signals that correspond to respective levels of a hierarchy of sub-blocks in the memory blocks. A global decoder receives the sub-block selection signals and responsively generates segment activation signals for respective segments of memory blocks that correspond to respective sub-blocks at a lowest level of the hierarchy of sub-blocks. Respective ones of a plurality of word line decoders are coupled to the word lines of respective ones of plurality of the memory blocks, and each is configured to receive the segment activation signals, a memory block selection signal and the word line selection signals and to responsively generate word line signals on the word lines coupled thereto. Respective ones of a plurality of source line decoders are coupled to source lines of respective ones of the plurality of memory blocks, and each is configured to receive the segment activation signals, a memory block selection signal, and the source line selection signals and to responsively generate source line signals on the source lines coupled thereto.

In some method embodiments of the present invention, a row address is decoded to generate a plurality of memory block selection signals, a plurality of word line selection signals, a plurality of source line selection signals, and a plurality of sub-block selection signals including respective groups of signals that correspond to respective levels of a hierarchy of sub-blocks in a plurality of memory blocks. The sub-block selection signals are decoded to generate segment activation signals for respective segments of memory blocks that correspond to respective sub-blocks at a lowest level of the hierarchy of sub-blocks. The segment activation signals, a memory block selection signal and the word line selection signals are decoded to generate word line signals for the memory blocks. The segment activation signals, a memory block selection signal, and the source line selection signals are decoded to generate source line signals for the memory blocks.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Figure 4:
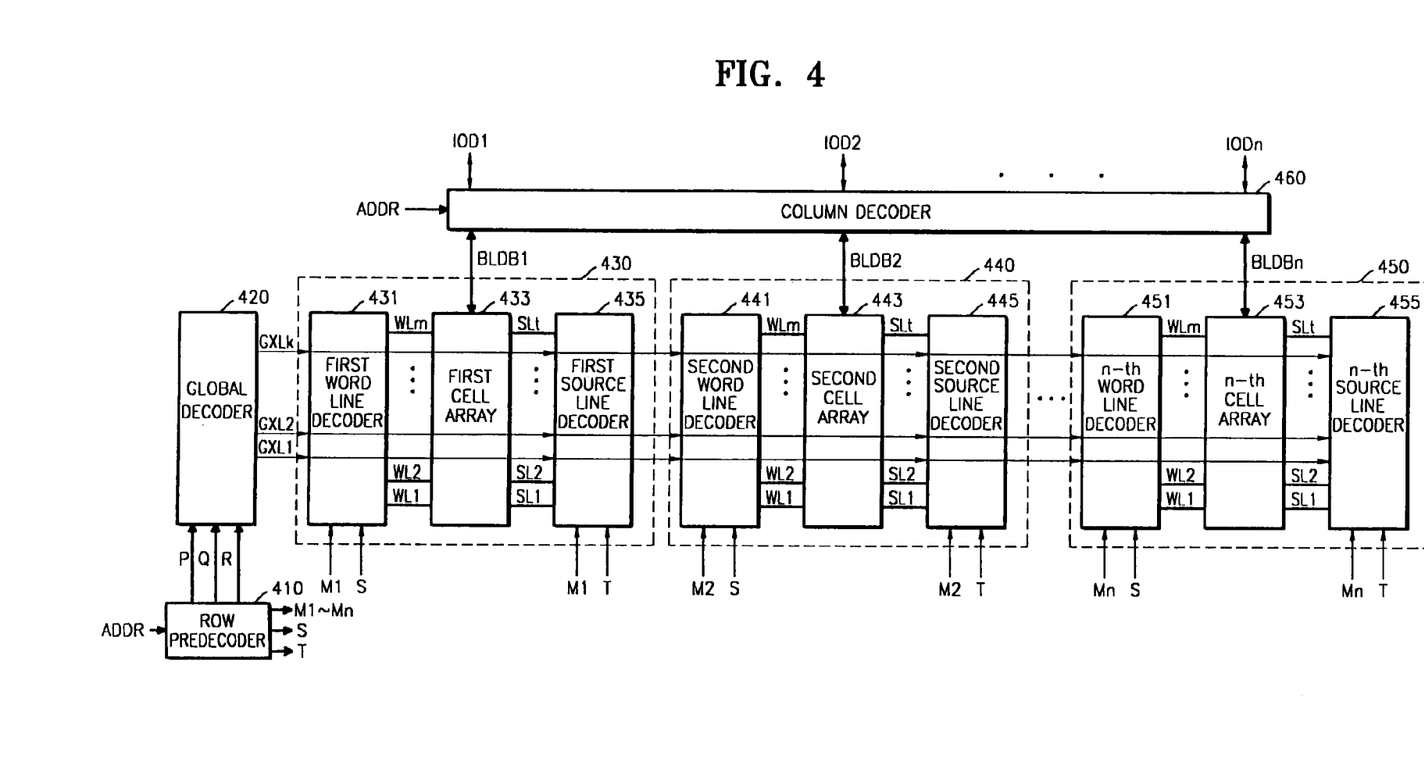
FIG. 4 is a block diagram of a memory device having a row decoder according to some exemplary embodiments of the present invention.
Figure 6:
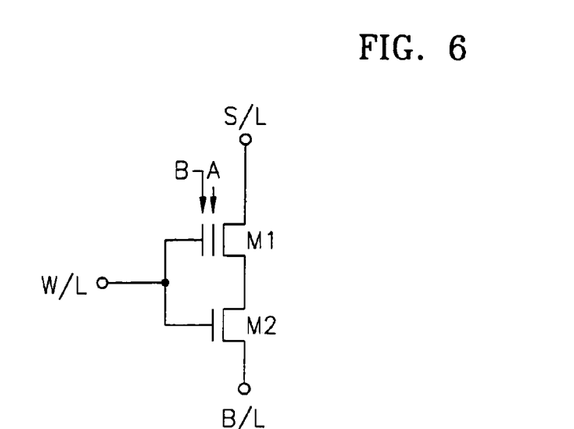
FIG. 6 is an equivalent circuit diagram of a pair of memory cell MOSFETs (Metal-Oxide-Semiconductor Field Effect Transistors) shown in FIG. 5.

FIG. 4 is a block diagram of a semiconductor memory device according to some embodiments of the present invention. FIG. 5 is a detailed view of a part of a cell array shown in FIG. 4. FIG. 6 is an equivalent circuit diagram of a memory cell MOSFET (Metal-Oxide-Semiconductor Field Effect Transistor) shown in FIG. 5. In FIGS. 4 and 5, WL1, WL2, ..., WLm are word lines, BL1, BL2, ..., BLz are bit lines, and SL1, SL2, ..., SLt are source lines.

With reference to FIG. 4, a memory device according to some exemplary embodiments of the present invention includes a predecoder 410, a global decoder 420, word line decoders 431, 441, ..., 451, source line decoders 435, 445, ..., 455, cell arrays 433, 443, ..., 453, and a column decoder 460. A row decoder, i.e., a logic circuit for selectively activating word lines connected to memory cells in order to read or write data, includes the word line decoders 431, 441, ..., 451 and source line decoders 435, 445, ..., 455 in respective memory blocks 430, 440, ..., 450. The row decoder further includes the predecoder 410 and the global decoder 420.

A column decoder 460, i.e., a logic circuit for inputting and outputting data through bit lines connected to memory cells in order to read or write data, decodes an externally-supplied address signal ADDR and provides cell data to write to an active memory cell MOSFET corresponding to a selected bit line, or receives cell data read from the active memory cell MOSFET. In FIG. 4, data input to or output from the column decoder 460 are represented as IOD1, IOD2, ..., IODn, and data exchanged between the column decoder 460 and bit lines are represented as BLDB1, BLDB2, ..., BLDBn.

Figure 7:
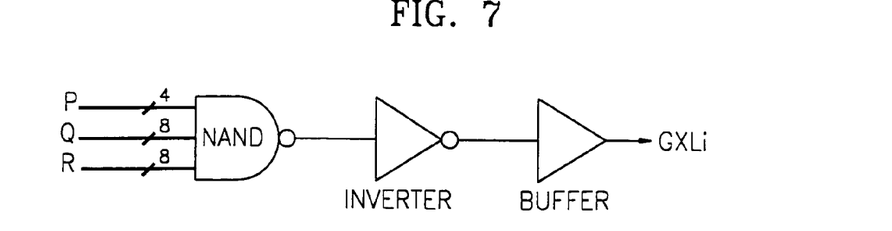
FIG. 7 is a schematic diagram illustrating a global decoder according to some embodiments of the present invention.

The predecoder 410 decodes an address signal ADDR and generates sub-block selection signals P, Q, R, word line selection signals S, source line selection signals T, and memory block selection signals M1–Mn. The sub-block selection signals P, Q, R define a hierarchy of sub-blocks in the memory cells, along the lines discussed above with reference to FIG. 1. The global decoder 420, configured of logic gates as shown in FIG. 7, decodes the sub-block selection signals P, Q, R and generates segment activation signals GXL1, GXL2, ..., GXLk corresponding to respective segments of the memory blocks 430, 440, ..., 450. GLXi is one of GXL1, GXL2, ..., GXLk, where the segments correspond to the sub-blocks of the lowest level of the hierarchy of sub-blocks defined by the sub-block selection signals P, Q, R. The segment activation signals GXL1, GXL2, ..., GXLk activate respective groups of word lines and source lines for respective segments in the memory blocks 430, 440, ..., 450.

In some embodiments according to the present invention, there are 2048 (2k) word lines in each of the memory blocks 430, 440, ..., 450. The selection signals P, Q, R, S, T are provided on 4, 8, 8, 8, and 4 signal lines, respectively, and the number of memory block selection signal lines M1–Mn corresponds to the number of memory blocks 430, 440, ..., 450. The memory block selection signals M1–Mn activate/deactivate respective ones of the memory blocks 430, 440, ..., 450.

Among the sub-block selection signals P, Q, R, P includes 4 signal lines and corresponds to the 4 highest-order memory sub-blocks. Q, made up of 8 signal lines, corresponds to 8 memory sub-blocks in the memory sub-blocks selected by P, and R, made up of 8 signal lines, corresponds to 8 memory sub-blocks in the memory sub-blocks selected by Q. Word lines are divided into respective groups in respective memory blocks 430, 440, . . . , 450, and each of the groups is further subdivided into sub-groups of word lines for respective segments in the blocks. In the exemplary embodiments, the segment activation signals GXL1, GXL2, . . . , GXLk are produced on 256 signal lines (i.e., k=256), and respective segment activation signals GXL1, GXL2, . . . , GXLk activate/deactivate word lines belonging to respective segments, such that the global decoder 420 maps the 28 signal lines of the sub-block selection signals P, Q, R to the 256 signal lines for the segment activation signals GXL1, GXL2, . . . , GXLk. In the illustrated embodiments, the number of word lines belonging to one segment is 8. The word line selection signals, S, made up of 8 signal lines, activate/deactivate selected ones of 8 word lines belonging to a segment.

As shown in FIG. 5, two source terminals in memory cell MOSFETs are connected to each other at respective intersections of two word lines and one bit line. Here, there may be 3, 4, or more memory cell MOSFETs at each respective intersection. In this case, more than 3 word lines correspond to a source line, and 3 or 4 source terminals connected to each other can receive a source line signal DSLi commonly. Therefore, when two source terminals are connected to each other as shown in FIG. 5, source line selection signals, T, can supply a source line signal DSLi through 4 lines, which is half the number of S signal lines. In the same way, when more than 3 source terminals are connected to each other, source line selection signals, T, can supply a source line signal DSLi through a number of signal lines which is only one third or one fourth the number of S signal lines.

Figure 8:
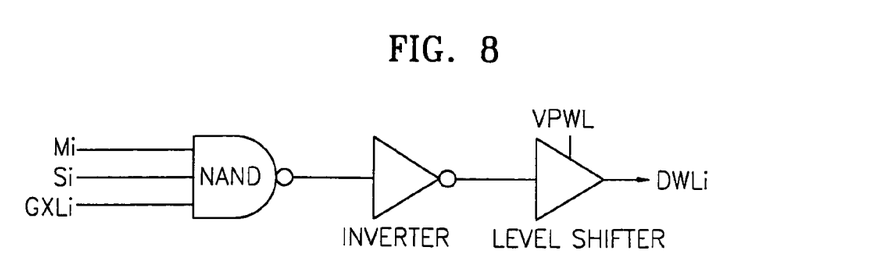
FIG. 8 is a schematic diagram illustrating a word line decoder according to some embodiments of the present invention.

The word line decoders 431, 441, . . . , 451, configured with logic gates as shown in FIG. 8, decode the segment activation signals GXL1, GXL2, . . . , GXLk and a memory block selection signal for example, M1 in 430, and word line selection signals S of the respective memory blocks 430, 440, . . . , 450, and responsively generate word line signals DWLi, e.g., DWL1, DWL2, . . . , DWLm that are provided on word lines WL1, WL2, . . . , WLm in respective memory blocks 430, 440, . . . , 450 to activate memory cell MOSFETs. As described above, the memory block selection signals (for example, M1 in 430) selectively activate the memory blocks 430, 440, . . . , 450. The word line selection signals S selectively activate word lines in the respective segments.

Figure 9:
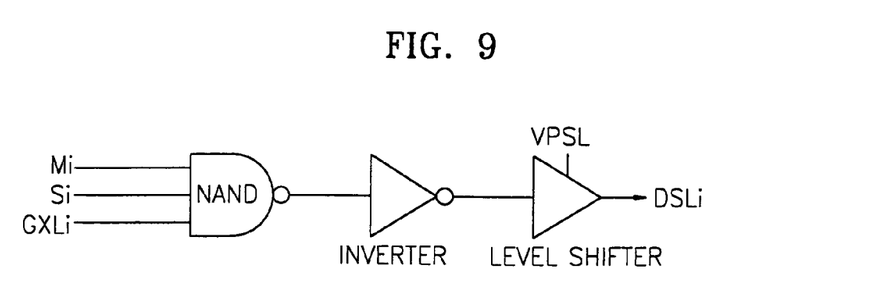
FIG. 9 is a schematic diagram illustrating a source line decoder according to further embodiments of the present invention.

The source line decoders 435, 445, . . . , 455, configured with logic gates as shown in FIG. 9, decode the segment active signals GXL1, GXL2, . . . , GXLk, the memory block selection signal (for example, M1 in 430), and source line selection signals T, and responsively generate a source line signals DSLi, e.g., DSL1, DSL2, . . . , DSLt, that are provided on source lines SL1, SL2, . . . , SLt in the memory blocks 430, 440, . . . , 450. As described above, the source line selection signals T can make one source line corresponding to more than one word line in the respective segments active.

The cell arrays 433, 443, . . . , 453, as shown in FIG. 5, receive the word line signals DWLi over the word lines WL1, WL2 . . . , WLm-1, WLm at gate terminals of the memory cell MOSFETs Q1, Q2, . . . , Q1, receive the source line signals DSLi over source lines SL1, . . . , SLt at source terminals of the memory cell MOSFETs Q1, Q2, . . . , Q1. The drain terminals of the memory cell MOSFETs Q1, Q2, . . . , Q16 are connected to bit lines near respective intersections of word lines and bit lines in the respective memory blocks 430, 440, . . . , 450. Source terminals in the memory cell MOSFETs in adjacent rows are connected to one another. FIG. 6 shows an equivalent circuit model of a flash memory cell MOSFET. B/L is a drain terminal connected to a bit line, S/L is a source terminal, which receives the source line signal DSLi, and W/L is a gate terminal which receives the word line active signal DWLi.

A flash MOSFET can be modeled as an equivalent circuit including a storage MOSFET M1 having a floating gate A and a control gate B, and a selection MOSFET M2. Table 1 shows voltages that may be applied to memory cell MOSFETs for a program operation in which data is written in memory cells, an erase operation in which data is erased from memory cells, and a read operation in which data is read from memory cells. In general, erase operations are performed in units of pages, and program operations are performed in units of bytes (8 bits) or words (16 bits).

TABLE 1

| Operation mode | Selection | B/L (Volts) | W/L (Volts) | S/L (Volts) | Bulk (Volts) |
| --- | --- | --- | --- | --- | --- |
| Program | Yes | 0 | VT (1.5) | Vpp (10) | 0 |
|  | No | Vcc(3.3) | 0 | 0 | 0 |
| Erase | Yes | 0 | Vee (12) | 0 | 0 |
|  | No | 0 | 0 | 0 | 0 |
| Read | Yes | 1 | Vread (3) | 0 | 0 |
|  | No | 0 | 0 | 0 | 0 |

The word line decoders 431, 441, . . . , 451 apply word line signals on word lines WL1, WL2, . . . , WLm for program, erase, and read operations. As shown in Table 1, for a program operation, an erase operation, and a read operation, a word line signal DWLi has a voltage VT, Vee, and Vread, respectively. This may be achieved by selectively applying VT, Vee, and Vread for selection of a program operation, an erase operation, and a read operation, respectively, to a power input VPWL of a level shifter that generates the word line activation signal DWLi, as shown in FIG. 8. For a program operation, a source line signal DSLi has a voltage Vpp, and in erase and read operations, a source line signal DSLi have a voltage of 0 Volts. This may be achieved by selectively applying Vpp for selection of a program operation to a power input VPSL of a level shifter that generates the source line signal DSLi, as shown in FIG. 9. Also, for an erase or a read operation, respective source line selection signals T are a first logic level (for example, 0.0 Volts), while for a program operation, respective source line selection signals T are a second logic level (for example, 3.0 Volts) for selection and a first logic level (for example, 0.0 Volts) for non-selection.

According to some exemplary embodiments of the present invention, a memory device has a global decoder 420 which decodes hierarchical sub-block selection signals P, Q, R and generates segment activation signals GXL1, GXL2, . . . , GXLk corresponding to segments of the memory blocks 430, 440, . . . , 450. For a device having a large number of memory blocks, the number of signal lines provided to word line decoders 431, 441, . . . , 451 and source line decoders 435, 445, . . . , 455 can be reduced dramatically in comparison to conventional devices that provide sub-block selection signals to each block. For example, in the embodiment described above where there are 2048 (2k) word lines in respective memory blocks 430, 440, . . . , 450, a conventional semiconductor memory device needs 28 P, Q, R, and S signal lines for each of the word line decoders 431, 441, . . . , 451, and needs 24 P, Q, R, T signal lines for each of the source line decoders 435, 445, . . . , 455.

However, according to some embodiments of the present invention, the number of signal lines can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

As described above, in a row decoder of a semiconductor memory device of the present invention, the number of signals commonly supplied to word line decoders and source line decoders is reduced dramatically, and these signals can select a word line and a source line in a predetermined segment selected by a global decoder. Therefore, area consumed by memory block selection signal lines can be reduced, which can also reduce overall chip size.

What is claimed is:

1. A memory device, comprising:
    a plurality of memory blocks, each block including a plurality of memory cells;
    a predecoder that receives a row address and responsively generates a plurality of memory block selection signals, a plurality of word line selection signals, a plurality of source line selection signals, and a plurality of sub-block selection signals including respective groups of signals that correspond to respective levels of a hierarchy of sub-blocks in the memory blocks;
    a global decoder that receives the sub-block selection signals and responsively generates segment activation signals for respective segments of memory blocks that correspond to respective sub-blocks at a lowest level of the hierarchy of sub-blocks;
    a plurality of word line decoders coupled to word lines of respective ones of plurality of the memory blocks, each word line decoder configured to receive the segment activation signals, a memory block selection signal and the word line selection signals and to responsively generate word line signals on the word lines coupled thereto; and
    a plurality of source line decoders coupled to source lines of respective ones of the plurality of memory blocks, each source line decoder configured to receive the segment activation signals, a memory block selection signal, and the source line selection signals and to responsively generate source line signals on the source lines coupled thereto.

2. A memory device according to claim 1, wherein the sub-block selection signals define a number of sub-blocks at the lowest level of the hierarchy of sub-blocks, and wherein the number of segment activation signals equals the number of sub-blocks at the lowest level of the hierarchy of sub-blocks.

3. A memory device according to claim 1, wherein the number of sub-block selection signals is less than the number of segment activation signals.

4. A memory device according to claim 1, wherein the memory cells comprise flash memory cells.

5. A memory device according to claim 1, wherein respective ones of the segment activation signals activate respective groups of word lines in the memory blocks.

6. A memory device according to claim 1, wherein respective ones of the memory block selection signals activate respective ones of the memory blocks.

7. A memory device according to claim 1, wherein respective ones of the word line selection signals activate respective word lines.

8. A memory device according to claim 1, wherein respective ones of the source line selection signals activate respective source lines.

9. A memory device according to claim 8, wherein each source line is coupled to memory cells in at least two adjacent rows.

10. A memory device according to claim 1, further comprising a column decoder that receives a column address and responsively transfers data from the memory blocks from selected bit lines.

11. A flash memory device, comprising:
    a plurality of memory blocks, each block including:
        a plurality of flash memory cells, each including a source terminal, a drain terminal, and a gate terminal;
        a plurality of word lines, respective ones of which are coupled to gate terminals of memory cells in respective rows; and
        a plurality of source lines, respective ones of which are coupled to source terminals of memory cells in respective pairs of adjacent rows;
    a predecoder that receives a row address and responsively generates a plurality of memory block selection signals, a plurality of word line selection signals, a plurality of source line selection signals, and a plurality of sub-block selection signals including respective groups of signals that correspond to respective levels of a hierarchy of sub-blocks in the memory blocks;
    a global decoder that receives the sub-block selection signals and responsively generates segment activation signals for respective segments of memory blocks that correspond to respective sub-blocks at a lowest level of the hierarchy of sub-blocks;
    a plurality of word line decoders, respective ones of which are coupled to the word lines of respective ones of plurality of the memory blocks, each word line decoder configured to receive the segment activation signals, a memory block selection signal and the word line selection signals and to responsively generate word line signals on the word lines coupled thereto; and
    a plurality of source line decoders, respective ones of which are coupled to source lines of respective ones of the plurality of memory blocks, each source line decoder configured to receive the segment activation signals, a memory block selection signal, and the source line selection signals and to responsively generate source line signals on the source lines coupled thereto.

12. A memory device according to claim 11, wherein the sub-block selection signals define a number of sub-blocks at the lowest level of the hierarchy of sub-blocks, and wherein the number of segment activation signals equals the number of sub-blocks at the lowest level of the hierarchy of sub-blocks.

13. A memory device according to claim 11, wherein the number of sub-block selection signals is less than the number of segment activation signals.

14. A method of operating a memory device including a plurality of memory blocks, each block including a plurality of memory cells, the method comprising:
    decoding a row address to generate a plurality of memory block selection signals, a plurality of word line selection signals, a plurality of source line selection signals, and a plurality of sub-block selection signals including respective groups of signals that correspond to respective levels of a hierarchy of sub-blocks in the memory blocks;

decoding the sub-block selection signals to generate segment activation signals for respective segments of memory blocks that correspond to respective sub-blocks at a lowest level of the hierarchy of sub-blocks;

decoding the segment activation signals, a memory block selection signal and the word line selection signals to generate word line signals for the memory blocks; and decoding the segment activation signals, a memory block selection signal, and the source line selection signals to generate source line signals for the memory blocks.

15. A method according to claim 14, wherein the sub-block selection signals define a number of sub-blocks at the lowest level of the hierarchy of sub-blocks, and wherein the number of segment activation signals equals the number of sub-blocks at the lowest level of the hierarchy of sub-blocks.

16. A method according to claim 14, wherein the number of sub-block selection signals is less than the number of segment activation signals.

17. A method according to claim 14, wherein the memory cells comprise flash memory cells.

18. A method according to claim 14, further comprising activating respective groups of word lines in the memory blocks responsive to respective ones of the segment activation signals.

19. A method according to claim 14, further comprising activating respective ones of the memory blocks responsive to respective ones of the memory block selection signals.

20. A method according to claim 14, further comprising activating respective word lines responsive to respective ones of the word line selection signals.

21. A method according to claim 14, further comprising activating respective source lines responsive to respective ones of the source line selection signals.

22. A method according to claim 21, wherein each source line is coupled to memory cells in at least two adjacent rows.

23. A method according to claim 14, further comprising decoding a column address to transfer data from the memory blocks from selected bit lines.

\* \* \* \* \*